(12) United States Patent
Kobayashi et al.

(10) Patent No.: US 9,270,199 B2
(45) Date of Patent: Feb. 23, 2016

(54) POWER CONVERSION APPARATUS WITH A LAMINATED BUS BAR COMPRISING AN EXPOSED HEAT RADIATING PORTION

(75) Inventors: Tomohiro Kobayashi, Tokyo (JP); Kohei Sakamoto, Tokyo (JP); Takeshi Yamamoto, Tokyo (JP); Yasuaki Mamoto, Tokyo (JP); Yukio Nakashima, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 260 days.

(21) Appl. No.: 13/984,216

(22) PCT Filed: Feb. 10, 2011

(86) PCT No.: PCT/JP2011/052927
§ 371 (c)(1),
(2), (4) Date: Aug. 7, 2013

(87) PCT Pub. No.: WO2012/108048
PCT Pub. Date: Aug. 16, 2012

(65) Prior Publication Data
US 2013/0322141 A1 Dec. 5, 2013

(51) Int. Cl.
*H02G 5/10* (2006.01)
*H02M 7/537* (2006.01)
(Continued)

(52) U.S. Cl.
CPC ............... *H02M 7/537* (2013.01); *H02G 5/005* (2013.01); *H02G 5/10* (2013.01); *H02M 7/003* (2013.01); *H05K 7/20918* (2013.01); *H02M 7/5387* (2013.01); *H05K 7/209* (2013.01)

(58) Field of Classification Search
CPC ....... H02G 5/005; H02G 5/10; H05K 7/2089; H02M 7/44; H02M 7/003
See application file for complete search history.

(56) References Cited

U.S. PATENT DOCUMENTS 3,829,647 A * 8/1974 Cleaveland .................... 200/289
5,528,073 A * 6/1996 Gilmore ........................ 257/584
(Continued)

FOREIGN PATENT DOCUMENTS

CN           101400246 A      4/2009
DE      102004018469 B3    10/2005
(Continued)

OTHER PUBLICATIONS

International Search Report (PCT/ISA/210) issued on Apr. 19, 2011, by the Japanese Patent Office as the International Searching Authority for International Application No. PCT/JP2011/052927.
(Continued)

*Primary Examiner* — Harry Behm
(74) *Attorney, Agent, or Firm* — Buchanan Ingersoll & Rooney PC

(57) ABSTRACT

A filter capacitor accumulating direct-current power and a semiconductor device module performing a switching operation that converts the direct-current power accumulated in the filter capacitor to alternating-current power are electrically connected with each other through a laminated bus bar. The laminated bus bar has a first bus bar and a second bus bar in which a plurality of connection conductors are laminated through an insulator. The second bus bar is provided with heat radiating portions that are formed by exposing a part of the conductor in each flat plate surface.

7 Claims, 9 Drawing Sheets

(51) Int. Cl.
*H02G 5/00* (2006.01)
*H02M 7/00* (2006.01)
H05K 7/20 (2006.01)
*H02M 7/5387* (2007.01)

(56) References Cited

U.S. PATENT DOCUMENTS

| | | | |
|---|---|---|---|
| 7,800,213 | B2 | 9/2010 | Bayerer |
| 2007/0114665 | A1 | 5/2007 | Bayerer |
| 2010/0259898 | A1 | 10/2010 | Kimura et al. |

FOREIGN PATENT DOCUMENTS

| | | | |
|---|---|---|---|
| DE | 102007003875 A1 | | 8/2008 |
| JP | 59-154712 | A | 9/1984 |
| JP | 59-154713 | A | 9/1984 |
| JP | 61-48511 | U | 4/1986 |
| JP | 3-111184 | U | 11/1991 |
| JP | 8-251779 | A | 9/1996 |
| JP | 10-135582 | A | 5/1998 |
| JP | 2002-118944 | A | 4/2002 |
| JP | 2002-157923 | A | 5/2002 |
| JP | 2004-135396 | A | 4/2004 |
| JP | 2005-065412 | A | 3/2005 |
| JP | 2005-287267 | A | 10/2005 |
| JP | 2006-019367 | A | 1/2006 |
| JP | 2006-031959 | A | 2/2006 |
| JP | 2007-006584 | A | 1/2007 |
| JP | 2007-142249 | A | 6/2007 |
| JP | 2008-177324 | A | 7/2008 |
| JP | 2008-245451 | A | 10/2008 |
| JP | 2009-077518 | A | 4/2009 |
| JP | 2009-194080 | A | 8/2009 |
| JP | 2009-278134 | A | 11/2009 |
| JP | 2009-296836 | A | 12/2009 |
| JP | 2010-028877 | A | 2/2010 |
| JP | 2010-142101 | A | 6/2010 |
| JP | 2010-172183 | A | 8/2010 |
| JP | 2010-183748 | A | 8/2010 |
| JP | 2010-212155 | A | 9/2010 |
| WO | WO 2010/073635 A1 | | 7/2010 |

OTHER PUBLICATIONS

Written Opinion (PCT/ISA/237) issued on Apr. 19, 2011, by the Japanese Patent Office as the International Searching Authority for International Application No. PCT/JP2011/052927.

Japanese Office Action issued on Dec. 25, 2012, 2 pages (with English language translation, 4 pages), JP0; Application No. 2012-550261.

European Search Report dated Dec. 5, 2014 issued in corresponding European Patent Appln. No. 11858214.7 (7 pages).

Office Action (First Office Action) issued on Feb. 28, 2015, by the Chinese Patent Office in corresponding Chinese Patent Application No. 201180067038.5, and an English Translation of the Office Action. (11 pages).

Official Communication issued Oct. 6, 2015 in corresponding European Patent Application No. 11858214.7 (8 pages).

Beukes, H.J. et al., "Busbar Design Considerations for High Power IGBT Covertors", Power Electronics Specialists Conference, 1997; PESC 97 Record., 28th Annual IEEE, St. Louis, MO, Jun. 22-27, 1997, vol. 2, Jun. 22, 1997, pp. 847-853.

\* cited by examiner

POWER CONVERSION APPARATUS WITH A LAMINATED BUS BAR COMPRISING AN EXPOSED HEAT RADIATING PORTION

FIELD

The present invention relates to a power conversion apparatus.

BACKGROUND

Regarding a power conversion apparatus having a relatively large capacity, it is desired for suppressing a surge voltage applied to a switching device that is turned off to reduce not only an inductance component of a main circuit but also a total inductance component including an inductance component between a semiconductor device module and a filter capacitor as much as possible. Therefore, in a conventional power conversion apparatus, such a configuration that a multi-layer bus bar in which a plurality of conductors are stacked through an insulator is used as a conductor for connecting between the semiconductor device module and the filter capacitor is often used (Patent Literature 1, for example).

One of the representative multi-layer bus bars is a laminated bus bar in which an external surface of the bus bar is coated with a laminate material such as a plastic film.

CITATION LIST

Patent Literature

Patent Literature 1: Japanese Patent Application Laid-open No. 2008-245451

SUMMARY

Technical Problem

However, a thermal conductivity of the laminate material is low and thus, in a case of the laminated bus bar using such the laminate material, heat generated in the semiconductor device module is likely to be transferred to the filter capacitor through a connection conductor having a high thermal conductivity, which causes a problem of rise in temperature of the filter capacitor. Therefore, an electrical distance between the filter capacitor using a heat-labile dielectric and the semiconductor device module is hard to decrease to a certain level or less, and there is a limit on reduction of the inductance component.

The present invention has been achieved to solve the above problems, and an object of the present invention is to provide a power conversion apparatus that can suppress rise in temperature of a filter capacitor and further reduce an inductance component between the filter capacitor and a semiconductor device module.

Solution to Problem

To solve the above-mentioned problems and achieve the object, a power conversion apparatus according to the present invention has a configuration in which a filter capacitor accumulating direct-current power and a semiconductor device module performing a switching operation that converts the direct-current power accumulated in the filter capacitor to alternating-current power are electrically connected with each other through a laminated bus bar. The laminated bus bar, in which a plurality of connection conductors are laminated through an insulator, has a heat radiating portion formed by exposing a conductor in a part of an area other than respective areas connecting to the semiconductor device module and the filter capacitor.

Advantageous Effects of Invention

According to the power conversion apparatus of the present invention, it is possible to suppress rise in temperature of a filter capacitor and further reduce an inductance component between the filter capacitor and a semiconductor device module.

DESCRIPTION OF EMBODIMENTS

Exemplary embodiments of a power conversion apparatus according to the present invention will be described below in detail with reference to the attached drawings. It should be noted that the present invention is not limited to the exemplary embodiments described below.

First Embodiment

Figure 1:
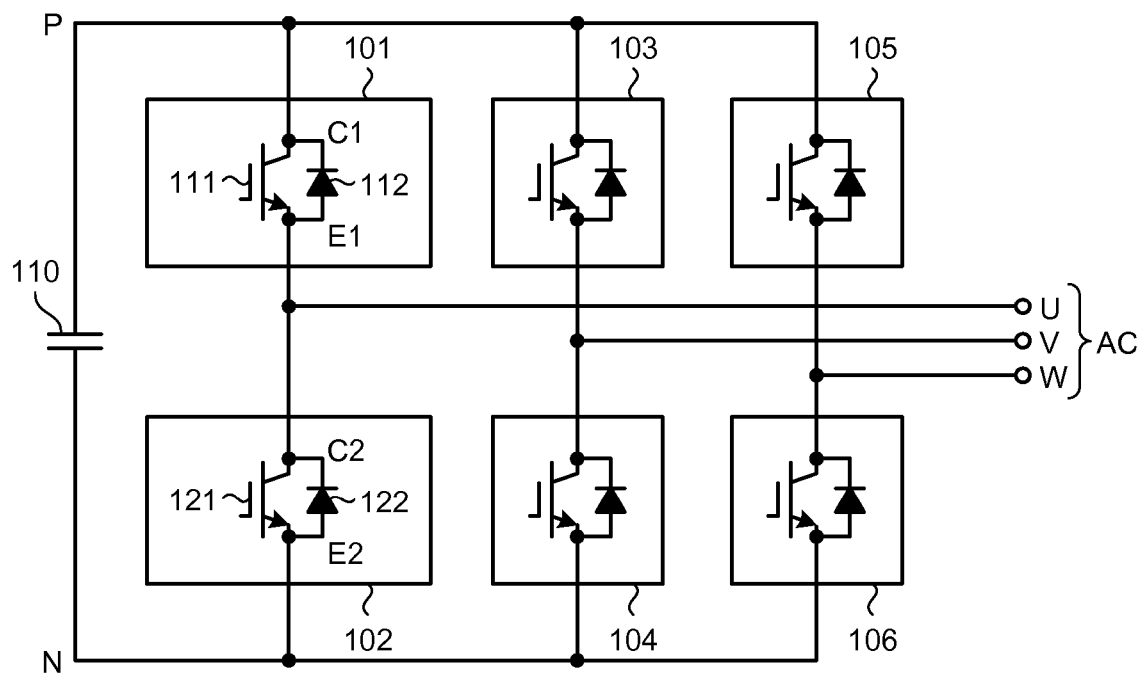
FIG. 1 depicts a configuration of a main circuit in a two-level power conversion apparatus.

FIG. 1 depicts a configuration of a main circuit in a two-level power conversion apparatus. In FIG. 1, semiconductor device modules 101 to 106 are connected between DC terminals of a filter capacitor 110 respectively having a positive potential (P) and a negative potential (N). More specifically, the semiconductor device module 101 as a positive arm and the semiconductor device module 102 as a negative arm are connected in series between the positive terminal (P) and the negative terminal (N), and a connection node between the semiconductor device modules 101 and 102 is branched to form an U-phase alternating-current (AC) terminal. Similarly, the semiconductor device module 103 as a positive arm and the semiconductor device module 104 as a negative arm are connected in series between the positive terminal (P) and the negative terminal (N), and a connection node between the semiconductor device modules 103 and 104 is branched to form a V-phase AC terminal. The semiconductor device module 105 as a positive arm and the semiconductor device module 106 as a negative arm are connected in series between the positive terminal (P) and the negative terminal (N), and a connection node between the semiconductor device modules 105 and 106 is branched to form a W-phase AC terminal. These semiconductor device modules 101 to 106 perform a switching operation that converts direct-current power accumulated in the filter capacitor 110 to alternating-current power.

The semiconductor device module 101 has an IGBT 111, and a flywheel diode (hereinafter referred to as "FWD") 112 connected in anti-parallel to the IGBT 111. A collector of the IGBT 111 and a cathode of the FWD 112 are connected with each other to form a terminal C1, and an emitter of the IGBT 111 and an anode of the FWD 112 are connected with each other to form a terminal E1. The semiconductor device module 102 has an IGBT 121, and an FWD 122 connected in anti-parallel to the IGBT 121. A collector of the IGBT 121 and a cathode of the FWD 122 are connected with each other to form a terminal C2, and an emitter of the IGBT 121 and an anode of the FWD 122 are connected with each other to form a terminal E2.

Figure 2:
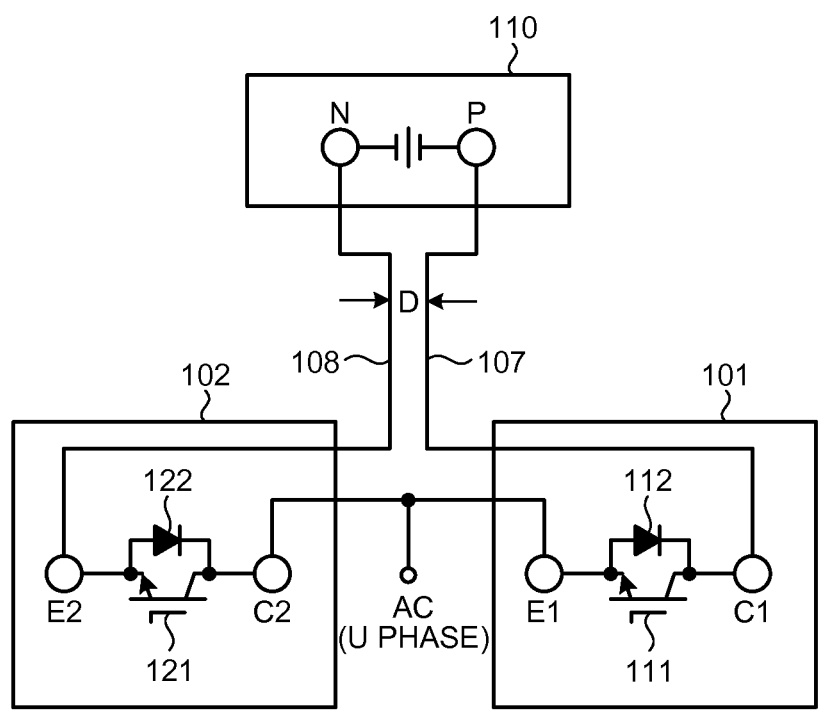
FIG. 2 depicts a connection configuration between a switching device and a DC terminal of a filter capacitor constituting a main circuit of the power conversion apparatus according to a first embodiment.

FIG. 2 depicts a connection configuration between the switching device and the DC terminal of the filter capacitor constituting the main circuit of the power conversion apparatus according to the first embodiment. FIG. 1 is a diagram represented in a form of a general circuit diagram while FIG. 2 is a connection diagram represented in a form close to an actual arrangement.

As shown in FIG. 2, when a connection conductor 107 connecting between the positive DC terminal (P) of the filter capacitor 110 and the terminal C1 of the semiconductor device module 101 and a connection conductor 108 connecting between the negative DC terminal (N) of the filter capacitor 110 and the terminal E2 of the semiconductor device module 102 are arranged in parallel and adjacent to each other, directions of currents flowing through the respective connection conductors 107 and 108 are opposite to each other. That is, the connection conductors 107 and 108 form outgoing and return current paths arranged in parallel and adjacent to each other. When currents flow through such the outgoing and return current paths in opposite directions, magnetic fields respectively generated by the opposite currents also are in opposite directions to each other and thus cancel each other, which causes decrease in an inductance component between the filter capacitor 110 and the semiconductor device module 101. Furthermore, by using parallel plate conductors to form the connection conductors 107 and 108 and designing a distance D between the conductors as small as possible, it is possible to greatly reduce the inductance component between the filter capacitor 110 and the semiconductor device module 101. It should be noted that what is constituted based on this operating principle is a laminated bus bar which will be described later.

Figure 3:
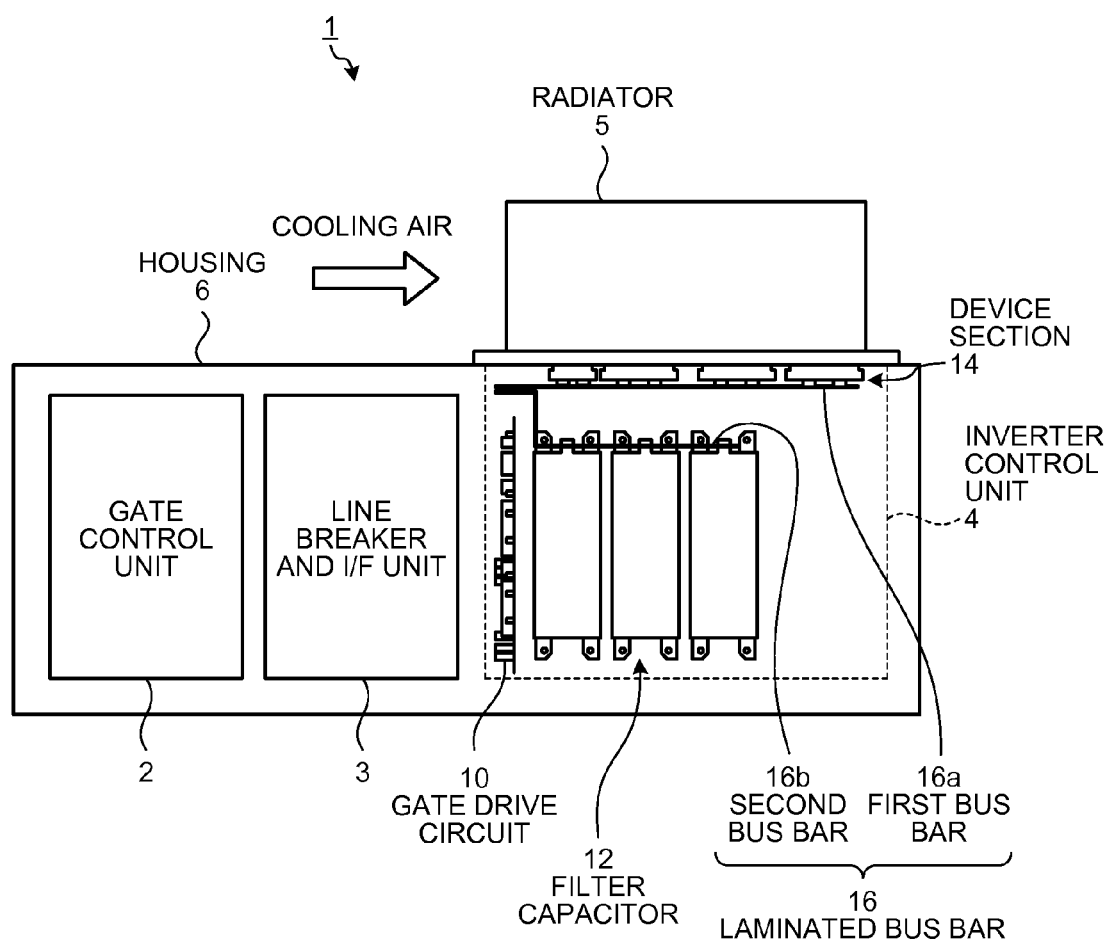
FIG. 3 is a normal view of the inside of the power conversion apparatus according to the first embodiment as viewed from an upper side of a car.
Figure 4:
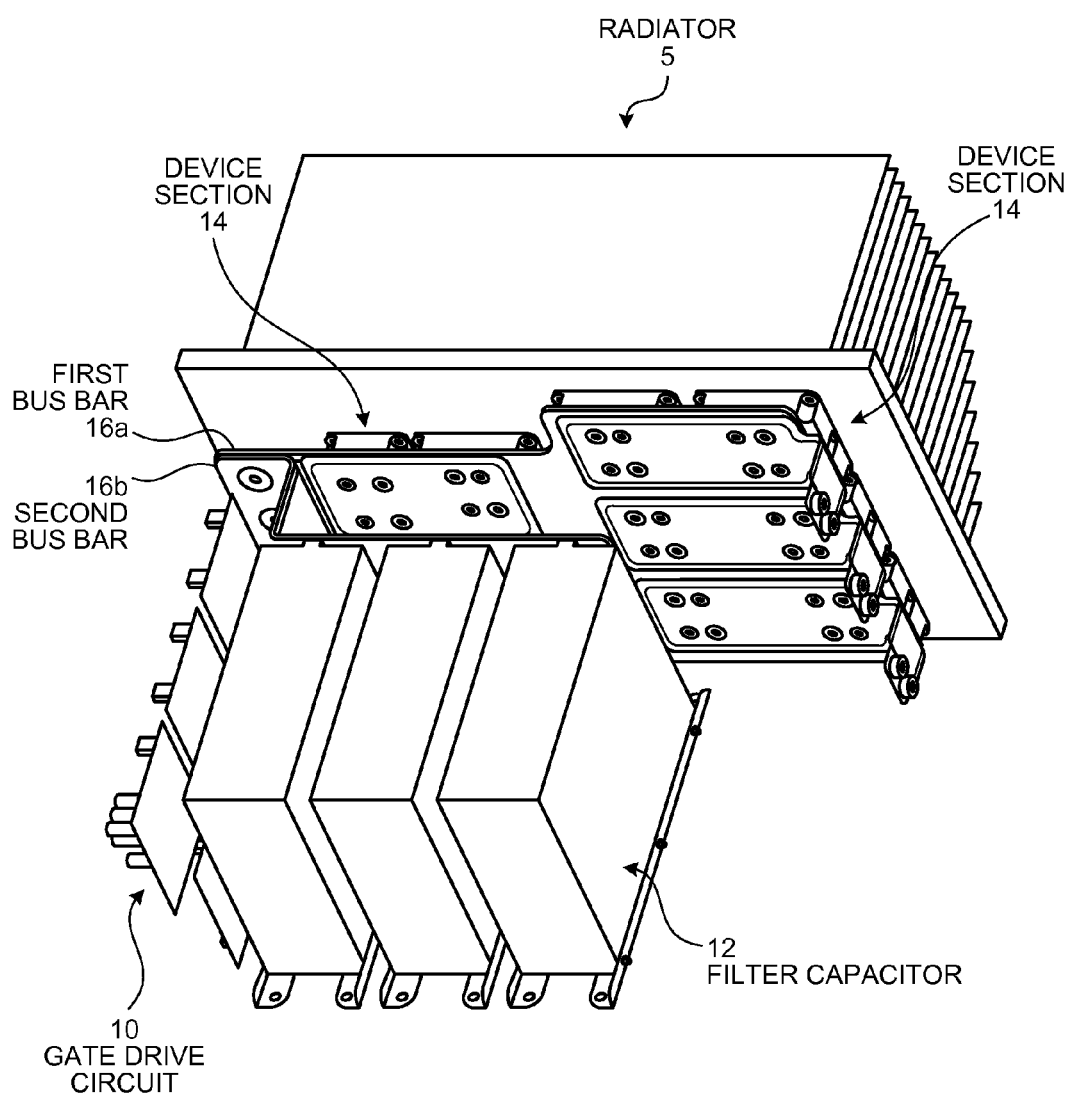
FIG. 4 is a perspective view of an inverter control unit and a radiator which are parts of the power conversion apparatus as viewed from the upper side of the car.

Next, a configuration of the power conversion apparatus according to the first embodiment is described with reference to FIGS. 3 and 4. FIG. 3, which depicts a configuration example in a case where the power conversion apparatus according to the first embodiment is mounted on a rail car, is a normal view of the inside of the power conversion apparatus 1 mounted on the rail car as viewed from an upper side of the car toward a rail side. FIG. 4 is a perspective view of an inverter control unit and a radiator which are parts of the power conversion apparatus as viewed from the upper side of the car.

The power conversion apparatus 1 has a gate control unit 2, a line breaker and I/F unit 3, an inverter control unit 4, and a radiator 5. The inverter control unit 4 has a gate drive circuit 10, a filter capacitor 12, and a device section 14. In an actually-mounted state on the car, the gate control unit 2, the line breaker and I/F unit 3, and the inverter control unit 4 excluding the radiator 5 are placed within a housing 6 and shielded from ambient air. Meanwhile, the radiator 5 is fitted to an external surface of the housing 6 to be exposed to the ambient air, and configured to be cooled by cooling air as required.

The device section 14 is a component including the plurality of the semiconductor device modules that have been described with reference to FIGS. 1 and 2. The gate control unit 2 is a component that generates a control signal required for PWM driving of the semiconductor device modules of the device section 14. The line breaker and I/F unit 3 is a component that has a function of interrupting a current flowing through the main circuit and a function of transferring a signal between the gate control unit 2 and the gate drive circuit 10. The gate drive circuit 10 is a component (drive circuit) that drives the semiconductor device modules of the device section 14 based on the control signal generated by the gate control unit 2. The filter capacitor 12 is a component (power supply source) that accumulates therein the direct-current power required for the power conversion.

The filter capacitor 12 and the device section 14 are electrically connected with each other through a laminated bus bar 16. The laminated bus bar 16 includes a first bus bar 16a formed in a flat-plate shape and connected to DC terminals of the device section 14, and a second bus bar 16b formed in a crank shape and connected to the DC terminals of the filter capacitor 12. The switching devices of the device section 14 are connected to the first bus bar 16a, while the DC terminals (the P terminal and the N terminal) of the filter capacitor 12 are connected to the second bus bar 16b.

Figure 5:
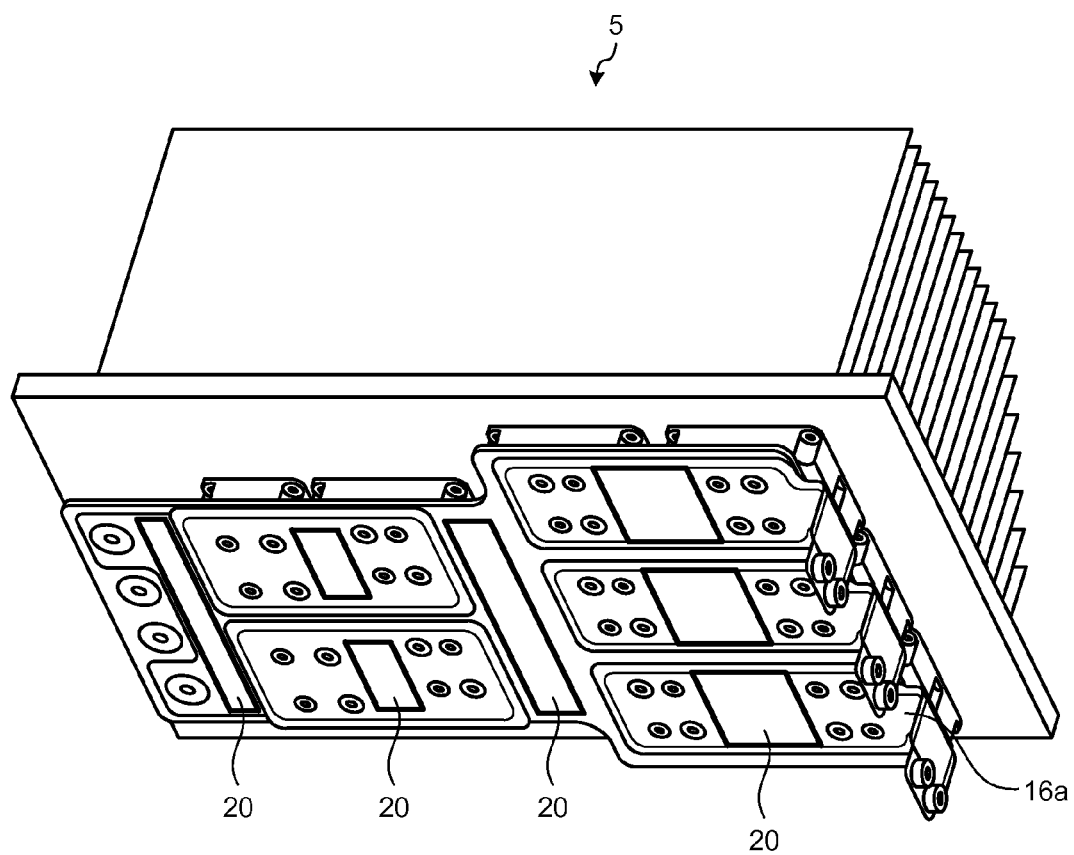
FIG. 5 is a perspective view of a device section as viewed from the upper side of the car.
Figure 6:
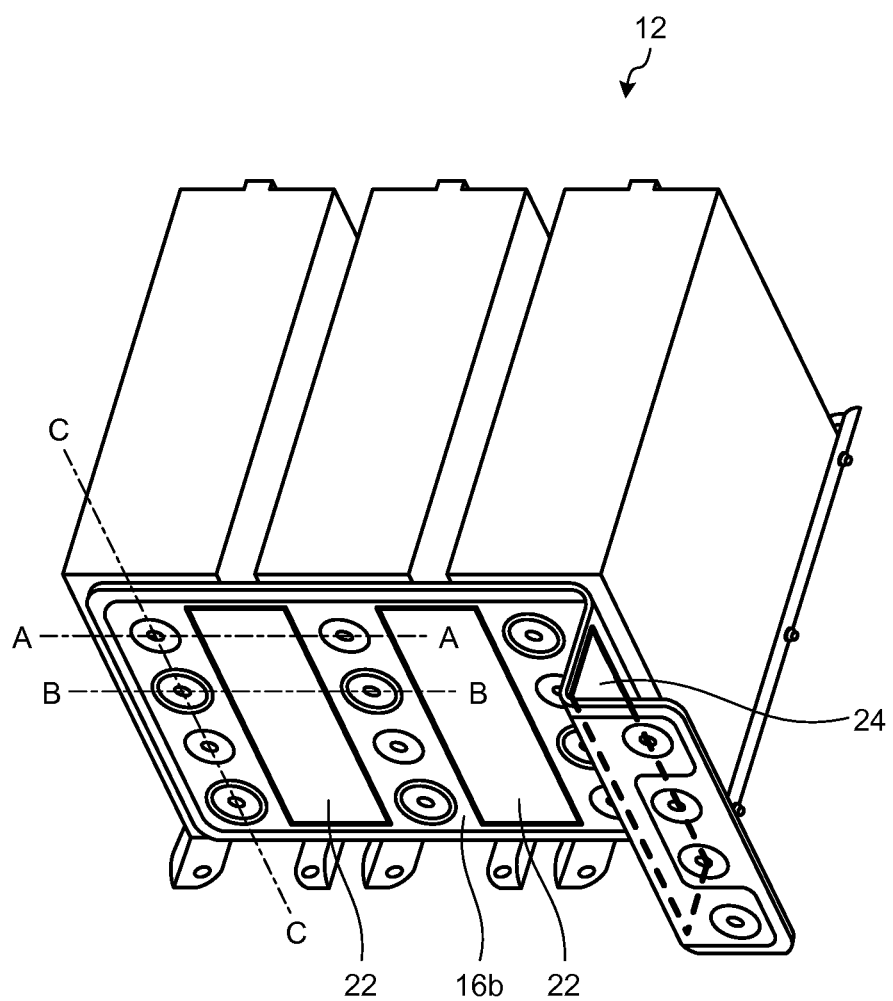
FIG. 6 is a perspective view of the filter capacitor as viewed from a lower side of the car.

FIGS. 5 and 6 are perspective views when the first bus bar 16a and the second bus bar 16b are detached from each other. More specifically, FIG. 5 is a perspective view of the device section 14 as viewed from the upper side of the car. FIG. 6 is a perspective view of the filter capacitor 12 as viewed from the lower side of the car.

The thermal conductivity of the laminate material used in the laminated bus bar 16 is low, as described above. Accordingly, heat generated in the device section 14 is likely to be transferred to the filter capacitor 12 through the connection conductor having a high thermal conductivity. Meanwhile, in the case of the power conversion apparatus according to the first embodiment, the conductor is exposed at a partial area of the first bus bar 16a and the second bus bar 16b, as shown in FIGS. 5 and 6.

More specifically, regarding the first bus bar 16a, as shown in FIG. 5, portions indicated by thick frames are heat radiating portions (heat radiating regions) 20 where the laminate material is not provided and thus the conductor is exposed. It should be noted that the heat radiating portion 20 is formed with avoiding connection points which are connecting to the device section and indicated by double circles. Moreover, heat radiating effect becomes extensive by making the exposed area as large as possible within a range which can secure an insulation distance between the connection point and the exposed conductor.

Regarding the second bus bar 16b, as shown in FIG. 6, portions indicated by thick frames are heat radiating portions 22 and 24 such that the conductor is exposed in a partial area. As in the case of the first bus bar 16a, the heat radiating portions 22 and 24 are formed with avoiding connection points which are connecting to the filter capacitor 12 and indicated by double circles or triple circles, and their area is made as large as possible within a range which can secure an insulation distance between the connection point and the exposed conductor. It should be noted that regarding the heat radiating portion 24 provided at the crank-shaped bent section of the second bus bar 16b, the heat radiating regions are provided on both surfaces.

It should be noted that each of the heat radiating portions 20, 22, and 24, which is provided to be a rectangular area in the example shown in FIGS. 5 and 6, is not limited to such the rectangular area but can have an arbitrary shape. Regarding the second bus bar 16b, the heat radiating regions on both surfaces of the crank-shaped bent section are provided as the heat radiating portion 24. Similarly, a heat radiating region may be provided also on a back surface side (side of the filter capacitor 12) of the heat radiating portion 22, as far as a working voltage and the insulation distance allow. The same applies to the first bus bar 16a. It should be noted that the heat radiating portions 20, 22, and 24 can be manufactured by any method as long as the conductor of the laminated bus bar 16 is exposed. For example, after the first bus bar 16a and the second bus bar 16b coated with the laminate material are formed, the laminate material at appropriate sections are removed to expose the conductor, thereby achieving them.

Since the conductor is exposed at the heat radiating portions 20, 22, and 24, the heat generated in the device section 14 is easily radiated to the air through the heat radiating portions 20, 22, and 24. Moreover, both of the first bus bar 16a and the second bus bar 16b are arranged such that their flat plate surfaces are along a vertical direction, which brings an effect that the heat radiation effect of the heat radiating portions 20, 22, and 24 is increased.

Figure 7:
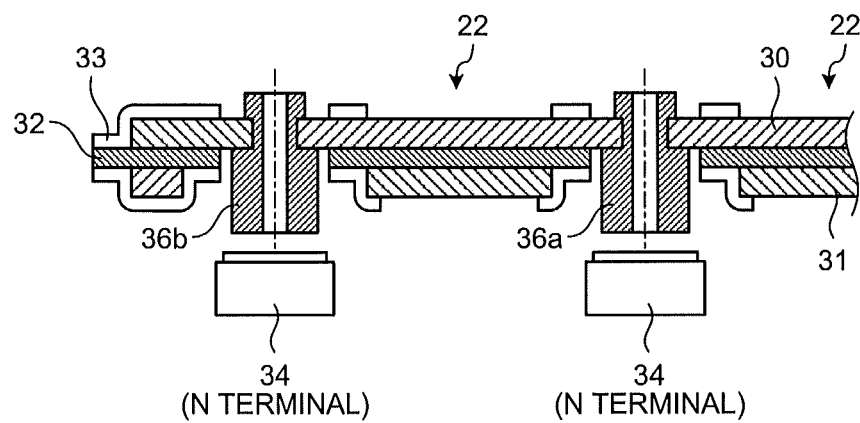
FIG. 7 is a cross-sectional view along a line A-A in FIG. 6.
Figure 8:
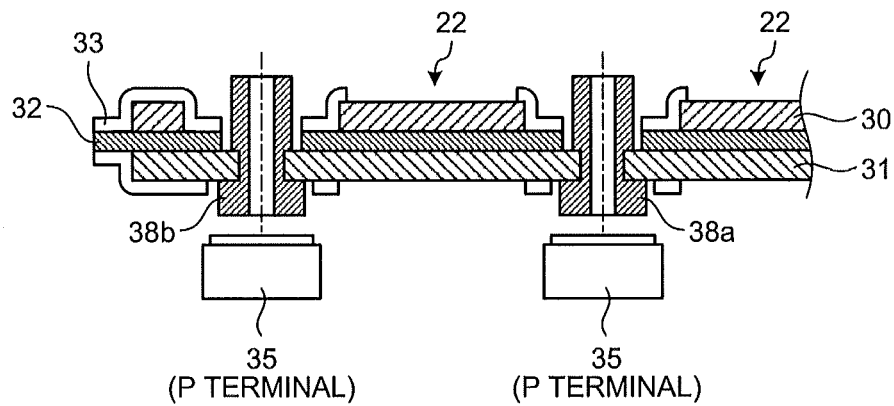
FIG. 8 is a cross-sectional view along a line B-B in FIG. 6.
Figure 9:
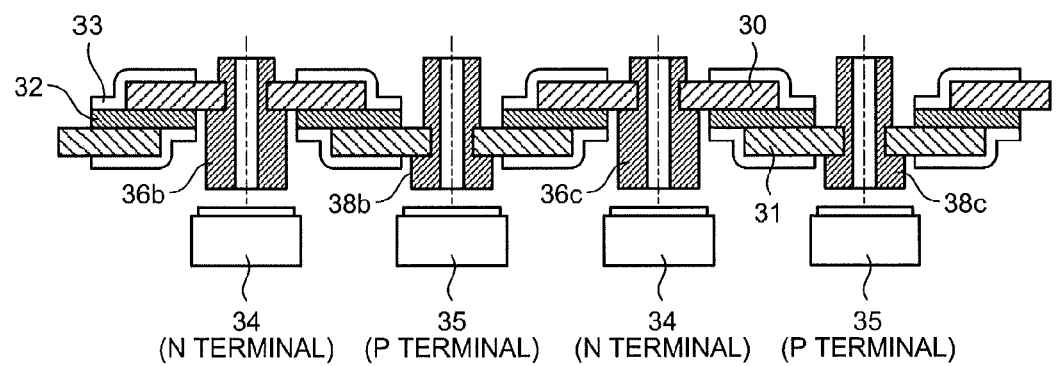
FIG. 9 is a cross-sectional view along a line C-C in FIG. 6.

FIGS. 7 to 9 depicts a structure of a terminal connection section between the filter capacitor 12 and the second bus bar 16b. FIG. 7 is a cross-sectional view along a line A-A in FIG. 6. FIG. 8 is a cross-sectional view along a line B-B in FIG. 6. FIG. 9 is a cross-sectional view along a line C-C in FIG. 6.

A structure in which an upper conductor 30 is connected to negative DC terminals (N terminals) 34 of the filter capacitor 12 is as shown in FIG. 7. Regarding the upper conductor 30 and a lower conductor 31 which sandwich an insulating sheet 32 and are covered with a laminate material 33, only the upper conductor 30 is connected to conductor connection terminals 36a and 36b, and connected to the negative DC terminals 34 through the conductor connection terminals 36a and 36b.

A structure in which the lower conductor 31 is connected to positive DC terminals (P terminals) 35 of the filter capacitor 12 is as shown in FIG. 8. Only the lower conductor 31 is connected to conductor connection terminals 38a and 38b, and connected to the positive DC terminals 35 through the conductor connection terminals 38a and 38b.

As shown in FIG. 9, in the cross-section along the line C-C orthogonal to the cross-section along the line A-A and the cross-section along the line B-B, the upper conductor 30 and the lower conductor 31 are connected alternately through the conductor connection terminals 36b, 38b, 36c, and 38c, and connected to appropriate ones of the negative DC terminals 34 and the positive DC terminals 35.

It should be noted that the bus bar shown in FIGS. 7 to 9 has a structure in which a pair of connection conductors are laminated through an insulator. However, the bus bar can have such a structure that three or more connection conductors are included and an insulator is sandwiched between adjacent connection conductors.

Next, an effect obtained by arranging the first bus bar 16a and the second bus bar 16b such that their flat plate surfaces are along the vertical direction is described. When a cubic heat radiating body is virtually considered, cooling efficiency is higher on side surfaces of the cube than on an upper surface thereof. In the case of the side surface of the cube, air warmed by heat radiation from the heat radiating body rises along the side surface, new cool air is successively supplied thereto from the bottom, and thus air flow due to natural convection is generated. On the other hand, in the case of the upper surface, air warmed by heat radiation from the heat radiating body rises, and air needs to be supplied thereto from the sides. However, in the case of the upper surface, it is necessary for guiding the air supplied from the sides to an upward direction to change the air flow direction to the orthogonal direction, which requires force other than rising force due to the natural convection. That is, it is not the upper surface but the side surface that can utilize the rising force due to the natural convection current without disturbing it, and thus the cooling efficiency becomes higher on the side surfaces than on the upper surface.

In the present embodiment, a case where the power conversion apparatus is mounted on the rail car is described as an example. In the case where the power conversion apparatus is mounted on the rail car, since the power conversion apparatus needs to be housed in a limited space in a lower part of the car body, there is a limit to a size of the housing that houses the units other than the radiator 5 and thus the size cannot be so large. Accordingly, providing a fan or the like in the housing is a matter to be avoided to the extent possible, and the technique according to the present embodiment that can promote the cooling effect due to the natural convection is very effective.

Also in a case of a ground-based power conversion apparatus, the technique of the present invention that a part of the conductor is exposed on the flat plate surface of the laminated bus bar has an effect of reducing the amount of thermal conduction to a heat-labile object, and thus the inductance component can be reduced while suppressing a temperature rise in the object. Therefore, even when all or a part of the flat plate surfaces of the laminated bus bar is not arranged along the vertical direction due to a structural reason for example, a sufficient heat radiation effect can be obtained by using cooling air other than the natural convection, for example, generated by a fan.

According to the power conversion apparatus of the present embodiment, as described above, a part of the conductor is exposed on the flat plate surface of the laminated bus bar that connects between the device section being a heat generator and the filter capacitor being a heat-labile object, and thus the heat generated by the device section can be partially dissipated before reaching the filter capacitor. As a result, the amount of heat that can be transferred to the filter capacitor can be reduced, and a length of the laminated bus bar can be shortened as compared with a conventional one, thereby enabling to further reduce the inductance component between the device section and the filter capacitor.

Furthermore, according to the power conversion apparatus of the present embodiment, every flat plate surface of the laminated bus bar is so arranged as to be along the vertical direction. As a result, the section where the conductor is exposed is a surface along the vertical direction (that is, a direction of gravitational force), and it is thus possible to effectively utilize the heat radiating effect (cooling effect) due to the natural convection.

Second Embodiment

Described in the first embodiment is that a part of the conductor is exposed on the flat plate surface of the laminated bus bar and thereby the amount of heat that can be transferred to the filter capacitor is reduced. In a second embodiment described below, the amount of external heat radiation is increased and thereby the amount of heat that can be transferred to the filter capacitor can be further reduced.

Figure 10:
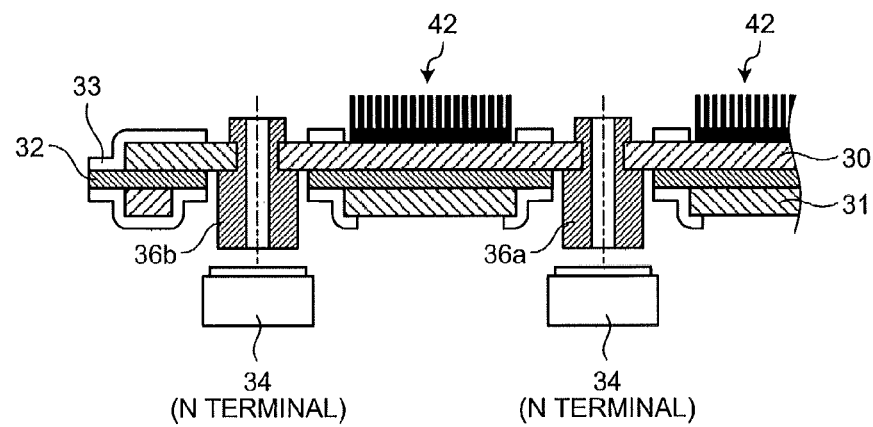
FIG. 10 depicts a structure of a laminated bus bar according to a second embodiment on the cross-sectional view of FIG. 7.
Figure 11:
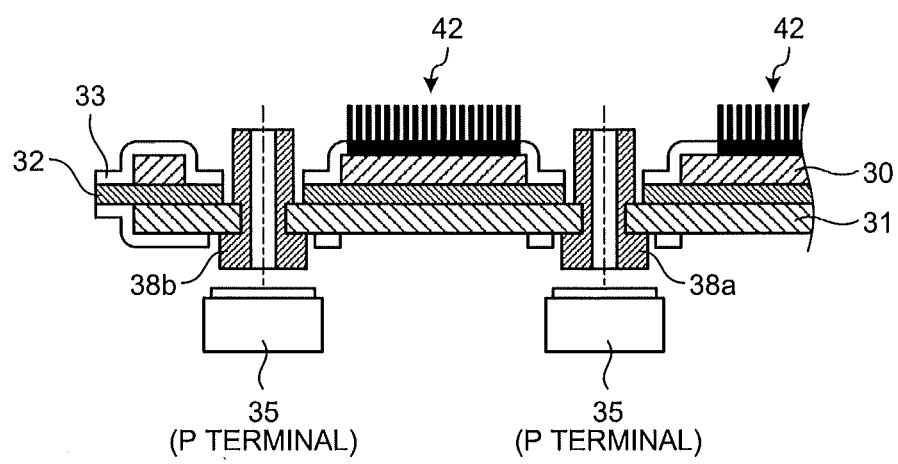
FIG. 11 depicts the structure of the laminated bus bar according to the second embodiment on the cross-sectional view of FIG. 8.

FIGS. 10 and 11 are explanatory diagrams of a structure of the laminated bus bar according to the second embodiment. As shown in FIGS. 10 and 11, according to the second embodiment, a heat radiating fin 42 is provided on the heat radiating portion 22 on the second bus bar 16b. It should be noted that, although FIGS. 10 and 11 show an example in which the heat radiating fin 42 is provided on the heat radiating portion 22 shown in FIG. 6, the heat radiating fin 42 can be provided on the heat radiating portion 20 on the first bus bar 16a. Due to this configuration, the heat radiation from the heat radiating portions 20 and 22 on the laminated bus bar is promoted, thereby increasing the amount of heat radiation. As a result, the amount of heat reaching the filter capacitor can be further reduced and thus the laminated bus bar can be further downsized, as compared with the first embodiment.

It should be noted that although a configuration in which a radiator is provided on the heat radiating portion of the second bus bar 16b as shown in FIGS. 10 and 11 is disclosed in the second embodiment, the radiator may be provided on the heat radiating portion of the first bus bar 16a.

Moreover, as explained in the first embodiment, when a structure side of the first bus bar 16a is peeled off, a radiator can be provided also on this heat radiating portion as far as the space allows.

Third Embodiment

In a third embodiment, a switching device provided in the device section 14 is described. As the switching device provided in the device section 14, one having such a configuration that a semiconductor transistor device (such as an IGBT and a MOSFET) made by using silicon (Si) is connected in anti-parallel to a semiconductor diode device made by using silicon is generally used.

However, the techniques according to the first and second embodiments are not limited to such the switching device made by using silicon. The present invention can be of course applied also to a switching device made by using silicon carbide (SiC), which has attracted attention recently, instead of silicon.

Since silicon carbide has a characteristic such that it can be used at a high temperature, when a switching device made by using silicon carbide is used as the switching device to be provided in the device section 14, an allowable operation temperature of the semiconductor device module can be increased to a higher temperature, thereby enabling to increase a carrier frequency. However, when the carrier frequency is increased, the amount of heat generation in the device section 14 increases, thereby causing a problem of the temperature rise in the filter capacitor 12. Therefore, it is difficult to simply perform a control to increase the carrier frequency without taking any measures against the problem of the temperature rise in the filter capacitor 12.

According to the techniques of the first and second embodiments, as described above, the amount of heat that may be transferred to the filter capacitor 12 can be reduced. Therefore, the problem of the temperature rise in the filter capacitor 12 can be solved, even when the amount of heat generated in the device section 14 increases with an increase of the carrier frequency. That is, even when the carrier frequency is increased by using the silicon carbide-based switching device, the problem of the temperature rise in the filter capacitor 12 can be solved while reducing the inductance component between the device section 14 and the filter capacitor 12, or suppressing the increase in the inductance component even if the inductance component increase.

It should be noted that silicon carbide (SiC) is an example of a semiconductor referred to as "wide band-gap semiconductor" considering a feature that a band-gap of silicon carbide is larger than that of silicon (Si). In addition to silicon carbide, a semiconductor formed by using, for example, a gallium nitride material or diamond also belongs to the wide band-gap semiconductor, and the characteristics thereof are similar to those of silicon carbide. Therefore, also a configuration using the wide band-gap semiconductor other than silicon carbide is included in the scope of the present invention.

A transistor device and a diode device formed based on such the wide band-gap semiconductor have a high breakdown voltage characteristic and a high allowable current density, and thus the transistor device and the diode device can be downsized. By using such the downsized transistor device and diode device, the semiconductor module incorporating these device therein can be also downsized.

Moreover, since the transistor device and the diode device formed by using the wide band-gap semiconductor also have a high heat resistance, the radiator and a cooler can be downsized, and thus the power conversion apparatus can be further downsized.

Furthermore, since the transistor device and the diode device formed by using the wide band-gap semiconductor have a low power loss, high efficiency of the switching device and the diode device can be realized, thereby enabling to realize high efficiency of the semiconductor device module.

It should be noted that the configurations described in the first to third embodiments are merely examples of a configuration of the present invention. The configurations may be combined with other well-known techniques. It is needless to mention that the present invention can be configured while modifying it without departing from the scope of the invention, such as omitting a part of the configuration.

INDUSTRIAL APPLICABILITY

As described above, the present invention is useful as a power conversion apparatus that can suppress the rise in temperature of the filter capacitor and further reduce the inductance component between the filter capacitor and the semiconductor device module.

REFERENCE SIGNS LIST 1 power conversion apparatus
2 gate control unit
3 line breaker and I/F unit
4 inverter control unit
5 radiator
6 housing
10 gate drive circuit
12, 110 filter capacitor
14 device section
16 laminated bus bar
16a first bus bar
16b second bus bar
20, 22, 24 heat radiating portion
30 upper conductor
31 lower conductor
32 insulating sheet
33 laminate material

34 negative DC terminal
35 positive DC terminal
36*a*, 36*b*, 36*c*, 38*a*, 38*b*, 38*c* conductor connection terminal
42 heat radiating fin
101 to 106 semiconductor device module
107, 108 connection conductor

The invention claimed is:

1. A power conversion apparatus comprising:
a filter capacitor accumulating direct-current power;
a semiconductor device module performing a switching operation that converts the direct-current power accumulated in the filter capacitor to alternating-current power; and
a laminated bus bar electrically connecting the filter capacitor and the semiconductor device module,
wherein the laminated bus bar comprises:
a bus bar in which a plurality of conductors are laminated through an insulator;
an external laminate material coating an external surface of the bus bar;
connection portions electrically connected to the semiconductor device module and the filter capacitor; and
a heat radiating portion in which the external laminate material is not provided and a conductor of the bus bar is exposed to air, and
wherein every surface of the exposed conductor of the heat radiating portion is formed to be along a vertical direction.

2. The power conversion apparatus according to claim 1, wherein a surface of the exposed conductor of the heat radiating portion is formed on a surface of a flat plate of the laminated bus bar.

3. The power conversion apparatus according to claim 2, wherein every surface of the flat plate of the laminated bus bar is a surface along a vertical direction.

4. The power conversion apparatus according to claim 3, wherein the laminated bus bar has a first bus bar electrically connected to the semiconductor device module and a second bus bar electrically connected to the filter capacitor, and the first bus bar and the second bus bar are formed separately.

5. The power conversion apparatus according to claim 1, wherein a heat radiating fin is provided on a part or whole of the heat radiating portion.

6. The power conversion apparatus according to claim 1, wherein a switching device provided in the semiconductor device module is formed based on a wide band-gap semiconductor.

7. The power conversion apparatus according to claim 6, wherein the wide band-gap semiconductor is a semiconductor using silicon carbide, a gallium nitride material, or diamond.

* * * * *